(12) United States Patent
Meir et al.

(10) Patent No.: US 9,007,835 B2
(45) Date of Patent: Apr. 14, 2015

(54) ENHANCED DATA STORAGE IN 3-D MEMORY USING STRING-SPECIFIC SOURCE-SIDE BIASING

(71) Applicant: Apple Inc., Cupertino, CA (US)

(72) Inventors: Avraham Poza Meir, Rishon Le-Zion (IL); Eyal Gurgi, Petah-Tikva (IL); Naftali Sommer, Rishon Le-Zion (IL); Yoav Kasorla, Kfar Netar (IL)

(73) Assignee: Apple Inc., Cupertino, CA (US)

( * ) Notice: Subject to any disclaimer, the term of this patent is extended or adjusted under 35 U.S.C. 154(b) by 231 days.

(21) Appl. No.: 13/865,351

(22) Filed: Apr. 18, 2013

(65) Prior Publication Data

US 2014/0313832 A1  Oct. 23, 2014

(51) Int. Cl.
*G11C 11/34* (2006.01)
*G11C 16/04* (2006.01)
*G11C 16/10* (2006.01)
*G11C 16/34* (2006.01)

(52) U.S. Cl.
CPC ............ *G11C 16/10* (2013.01); *G11C 16/0483* (2013.01); *G11C 16/3454* (2013.01)

(58) Field of Classification Search
CPC .... G11C 16/0483; G11C 16/10; G11C 16/24; G11C 16/3427; G11C 16/3418; G11C 16/26; G11C 16/04; G11C 16/06; G11C 7/12; G11C 7/18; G11C 5/02; G11C 16/3404

USPC ............ 365/185.17, 185.08, 185.09, 185.11, 365/185.18, 185.13
See application file for complete search history.

(56) References Cited

U.S. PATENT DOCUMENTS

| 8,004,885 B2 | 8/2011 | Yun et al. |
| 8,036,043 B2 | 10/2011 | Oh et al. |
| 8,203,882 B2 | 6/2012 | Hishida et al. |
| 2012/0140586 A1* | 6/2012 | Kim et al. ................. 365/230.03 |
| 2013/0223142 A1* | 8/2013 | Park et al. ..................... 365/184 |

* cited by examiner

*Primary Examiner* — Hien Nguyen
(74) *Attorney, Agent, or Firm* — Meyertons, Hood, Kivlin, Kowert & Goetzel, P.C.

(57) ABSTRACT

A method includes storing data in a memory, which includes multiple strings of analog memory cells arranged in a three-dimensional (3-D) configuration having a first dimension associated with bit lines, a second dimension associated with word lines and a third dimension associated with sections, such that each string is associated with a respective bit line and a respective section and includes multiple memory cells that are connected to the respective word lines. For a group of the strings, respective values of a property of the strings in the group are evaluated. Source-side voltages are calculated for the respective strings in the group, depending on the respective values of the property, and respective source-sides of the strings in the group are biased with the corresponding source-side voltages. A memory operation is performed on the strings in the group while the strings are biased with the respective source-side voltages.

20 Claims, 4 Drawing Sheets

ENHANCED DATA STORAGE IN 3-D MEMORY USING STRING-SPECIFIC SOURCE-SIDE BIASING

FIELD OF THE INVENTION

The present invention relates generally to data storage, and particularly to data storage in three-dimensional memory devices.

BACKGROUND OF THE INVENTION

Various types of three-dimensional (3-D) non-volatile memory devices, and methods for programming such devices, are known in the art. For example, U.S. Patent Application Publication 2012/0069657, whose disclosure is incorporated herein by reference, describes a memory device that includes a memory cell array, in some embodiments a three-dimensional Flash memory, a self interleaver configured to interleave and load data on the fly into a buffer circuit using an interleaving scheme, and a control logic configured to control programming of the interleaved data in the memory cell array.

U.S. Patent Application Publication 2012/0069664, whose disclosure is incorporated herein by reference, describes a Flash memory system and a word line interleaving method thereof. The Flash memory system includes a memory cell array, such as a three-dimensional array, and word line interleaving logic. The memory cell array is connected to a plurality of word lines. The word line (WL) interleaving logic performs an interleaving operation on WL data corresponding to at least two different word lines and programs data, including the interleaved data, to the memory cell array.

U.S. Patent Application Publication 2013/0028027, whose disclosure is incorporated herein by reference, describes a 3-D semiconductor memory device including a plurality of memory cell strings, includes a substrate and a channel that extends from the substrate. Memory cells may be disposed in layers in which the diameter of the channel varies. A programming verification operation may be carried out in a sequence whereby memory cells more likely to fail in programming are verified before attempting to verify memory cells that are less likely to fail programming. In an exemplary embodiment, the verification operation is performed on a memory cell disposed in a layer associated with a larger-diameter channel before performing the verification on a memory cell disposed in a layer associated with a smaller-diameter channel.

U.S. Pat. No. 8,036,043, whose disclosure is incorporated herein by reference, describes a non-volatile semiconductor memory device including a vertical array structure comprised of bit lines and source lines arranged in the same direction as the bit lines. Memory cell strings are vertically formed between each pair of the bit lines and source lines. Multiple strings of memory cells can be stacked in the vertical direction, and adjacent memory cell strings may share bit line or source line.

U.S. Pat. No. 8,203,882, whose disclosure is incorporated herein by reference, describes a non-volatile semiconductor storage device. When a data erase operation is performed in one memory cell block, a first voltage is applied to one source line selected from m source lines in the one memory cell block. A second voltage equal to a voltage of the source lines before the data erase operation begins is applied to the other source lines. Then, after a certain time delay from application of the first voltage, a third voltage smaller than the first voltage is applied to a third conductive layer of a source-side selection transistor connected to a selected source line. A fourth voltage is applied to one of first conductive layers connected to one of the memory transistor to be erased. The other first conductive layers are brought into a floating state.

U.S. Pat. No. 8,004,885, whose disclosure is incorporated herein by reference, describes a driving method of a three-dimensional memory device having a plurality of layers. One of the layers is selected. A well of the selected layer is biased with a first well voltage. A word line voltage is applied to a selected word line of the selected layer. A well of an unselected layer is biased with a second well voltage higher than the first well voltage.

SUMMARY OF THE INVENTION

An embodiment of the present invention that is described herein provides a method including storing data in a memory. the memory includes multiple strings of analog memory cells arranged in a three-dimensional (3-D) configuration having a first dimension associated with bit lines, a second dimension associated with word lines and a third dimension associated with sections, such that each string is associated with a respective bit line and a respective section and includes multiple memory cells that are connected to the respective word lines. For a group of the strings, respective values of a property of the strings in the group are evaluated. Source-side voltages are calculated for the respective strings in the group, depending on the respective values of the property, and respective source-sides of the strings in the group are biased with the corresponding source-side voltages. A memory operation is performed on the strings in the group while the strings are biased with the respective source-side voltages.

In some embodiments, calculating the source-side voltages includes equalizing programming speed over the strings in the group. In an embodiment, evaluating the property includes assessing a responsiveness of the strings in the group to programming, and calculating the source-side voltages includes assigning each string in the group a respective source-side voltage depending on the responsiveness of the string.

In another embodiment, evaluating the property includes determining respective target programming levels of the strings in the group, and calculating the source-side voltages includes assigning each string in the group a respective source-side voltage depending on a target programming level of the string. In yet another embodiment, evaluating the property includes verifying which of the strings are to be inhibited from receiving a subsequent programming pulse, and calculating the source-side voltages includes assigning the strings that are to be inhibited a first source-side voltage, and assigning the strings that are not to be inhibited a second source-side voltage that is different from the first source-side voltage.

In still another embodiment, calculating the source-side voltages includes dividing the group of strings into multiple subsets and assigning different source-side voltages to the respective subsets, and performing the memory operation includes reading the data from a plurality of the memory cells belonging respectively to the strings in the group while the subsets are biased with the respective different source-side voltages, and calculating one or more optimal read thresholds based on the read data. Calculating the optimal read thresholds may include assessing numbers of read errors in the data read from the respective subsets, and computing the read thresholds based on the numbers of errors. In a disclosed embodiment, evaluating the property includes assessing respective analog storage values stored in selected memory cells in the respective strings, and calculating the source-side voltages includes assigning each string in the group a respective source-side voltage depending on a respective analog storage value.

There is additionally provided, in accordance with an embodiment of the present invention, apparatus including a memory and storage circuitry. The memory includes multiple strings of analog memory cells arranged in a three-dimensional (3-D) configuration having a first dimension associated with bit lines, a second dimension associated with word lines and a third dimension associated with sections, such that each string is associated with a respective bit line and a respective section and includes multiple memory cells that are connected to the respective word lines. The storage circuitry is configured, for a group of the strings, to evaluate respective values of a property of the strings in the group, to calculate source-side voltages for the respective strings in the group depending on the respective values of the property, to bias respective source-sides of the strings in the group with the corresponding source-side voltages, and to perform a memory operation on the strings in the group while the strings are biased with the respective source-side voltages.

There is also provided, in accordance with an embodiment of the present invention, apparatus including an interface and storage circuitry. The interface is configured to communicate with a memory that includes multiple strings of analog memory cells arranged in a three-dimensional (3-D) configuration having a first dimension associated with bit lines, a second dimension associated with word lines and a third dimension associated with sections, such that each string is associated with a respective bit line and a respective section and includes multiple memory cells that are connected to the respective word lines. The storage circuitry is configured, for a group of the strings, to evaluate respective values of a property of the strings in the group, to calculate source-side voltages for the respective strings in the group depending on the respective values of the property, to bias respective source-sides of the strings in the group with the corresponding source-side voltages, and to perform a memory operation on the strings in the group while the strings are biased with the respective source-side voltages.

The present invention will be more fully understood from the following detailed description of the embodiments thereof, taken together with the drawings in which:

DETAILED DESCRIPTION OF EMBODIMENTS

Overview

Embodiments of the present invention that are described herein provide improved methods and systems for data storage in three-dimensional (3-D) non-volatile memory. In the disclosed embodiments, a memory controller stores data in a memory that comprises multiple analog memory cells, such as Flash cells, which are arranged in a 3-D configuration. The three dimensions of the memory are associated with Word Lines (WLs), Bit Lines (BLs) and sections, i.e., each memory cell is connected to a certain WL and a certain BL, and lies in a certain section.

In the disclosed 3-D configurations, the memory cells in the 3-D memory are arranged in strings, also referred to as pillars. Each string comprises a group of memory cells that are cascaded drain-to-source in series with one another. The drain of the first memory cell in the string is referred to as the drain-side of the string, and the source of the last memory cells in the string is referred to as the source-side of the string. During programming, readout and erasure, the strings are biased with suitable drain-side and source-side voltages.

In some embodiments, each string is biased with a respective source-side voltage that depends on a property of the string. As such, for example, strings associated with the same bit line may differ in source-side bias voltage from one another. Setting the source-side voltage on a string-by-string basis provides various performance benefits, such as reduced program disturb, retention shift and other types of distortion, and enables fast adaptation of read thresholds.

The source-side voltage of each string may be set based on various string properties, such as the responsiveness of the string to programming pulses, the target programming level of a selected memory cell in the string, or the threshold voltage of a selected memory cell in the string. Several examples of string properties, and corresponding source-side voltage setting schemes that achieve enhanced performance, are described below.

System Description

Figure 1:
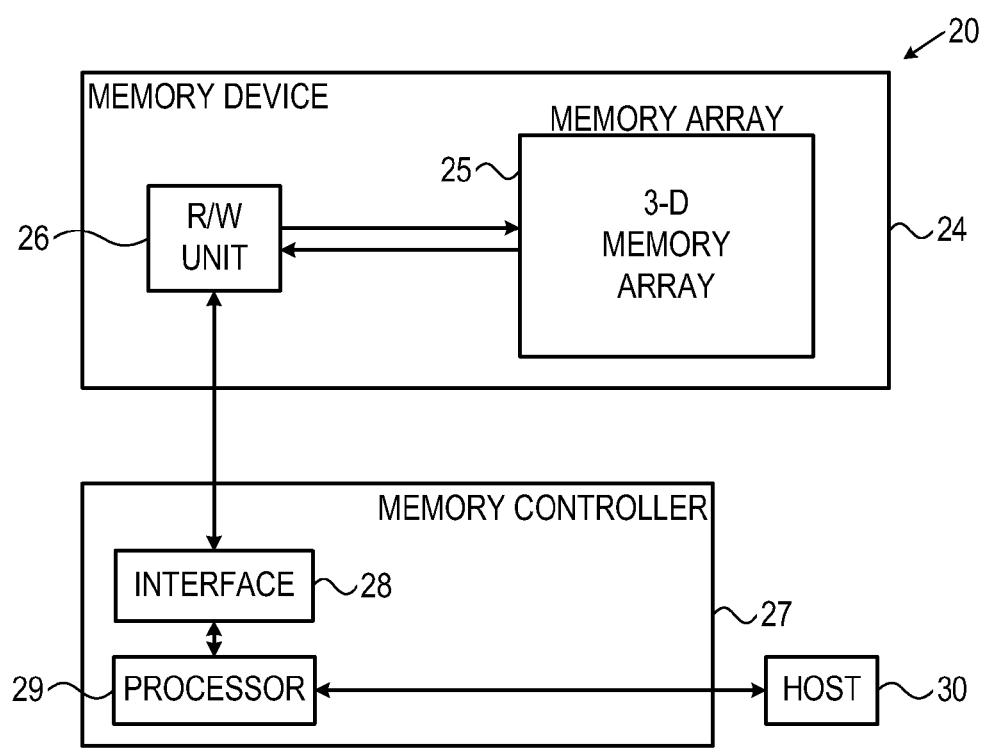
FIG. 1 is a block diagram that schematically illustrates a memory system, in accordance with an embodiment of the present invention.

FIG. 1 is a block diagram that schematically illustrates a memory system 20, in accordance with an embodiment of the present invention. System 20 can be used in various host systems and devices, such as in computing devices, cellular phones or other communication terminals, removable memory modules (sometimes referred to as "USB Flash Drives"), Solid State Disks (SSD), digital cameras, music and other media players and/or any other system or device in which data is stored and retrieved.

System 20 comprises a memory device 24, which stores data in a three-dimensional (3-D) memory cell array 25. The memory array comprises multiple 3-D memory blocks. Each memory block comprises multiple analog memory cells. The structure of memory 25 is explained in detail below. In the context of the present patent application and in the claims, the term "analog memory cell" is used to describe any memory cell that holds a continuous, analog value of a physical parameter, such as an electrical voltage or charge. Array 25 may comprise analog memory cells of any kind, such as, for example, NAND, NOR and Charge Trap Flash (CTF) Flash cells, phase change RAM (PRAM, also referred to as Phase Change Memory—PCM), Nitride Read Only Memory (NROM), Ferroelectric RAM (FRAM), magnetic RAM (MRAM) and/or Dynamic RAM (DRAM) cells.

The charge levels stored in the cells and/or the analog voltages or currents written into and read out of the cells are referred to herein collectively as analog values, analog storage values or storage values. The storage values may comprise, for example, threshold voltages or any other suitable kind of storage values. System 20 stores data in the analog memory cells by programming the cells to assume respective programming states, which are also referred to as programming levels. The programming states are selected from a finite set of possible states, and each programming state corresponds to a certain nominal storage value. For example, a 3 bit/cell MLC can be programmed to assume one of eight possible programming states by writing one of eight possible nominal storage values into the cell.

Memory device 24 comprises a reading/writing (R/W) unit 26, which converts data for storage in the memory device to analog storage values and writes them into the memory cells. In alternative embodiments, the R/W unit does not perform the conversion, but is provided with voltage samples, i.e., with the storage values for storage in the cells. When reading data out of array 25, R/W unit 26 converts the storage values of the memory cells into digital samples having a resolution of one or more bits. Data is typically written to and read from the memory cells in groups that are referred to as pages. In some embodiments, the R/W unit can erase a group of cells by applying one or more negative erasure pulses to the cells. Erasure is typically performed in entire memory blocks.

The storage and retrieval of data in and out of memory device 24 is performed by a memory controller 27. The memory controller comprises an interface 28 for communicating with memory device 24, and a processor 29 that carries out the various memory management functions. Memory controller 27 communicates with a host 30, for accepting data for storage in the memory device and for outputting data retrieved from the memory device. Memory controller 27, and in particular processor 29, may be implemented in hardware. Alternatively, the memory controller may comprise a microprocessor that runs suitable software, or a combination of hardware and software elements.

The configuration of FIG. 1 is an exemplary system configuration, which is shown purely for the sake of conceptual clarity. Any other suitable memory system configuration can also be used. Elements that are not necessary for understanding the principles of the present invention, such as various interfaces, addressing circuits, timing and sequencing circuits and debugging circuits, have been omitted from the figure for clarity.

Although the example of FIG. 1 shows a single memory device 24, system 20 may comprise multiple memory devices that are controlled by memory controller 27. In the exemplary system configuration shown in FIG. 1, memory device 24 and memory controller 27 are implemented as two separate Integrated Circuits (ICs). In alternative embodiments, however, the memory device and the memory controller may be integrated on separate semiconductor dies in a single Multi-Chip Package (MCP) or System on Chip (SoC), and may be interconnected by an internal bus. Further alternatively, some or all of the memory controller circuitry may reside on the same die on which the memory array is disposed. Further alternatively, some or all of the functionality of memory controller 27 can be implemented in software and carried out by a processor or other element of the host system. In some embodiments, host 30 and memory controller 27 may be fabricated on the same die, or on separate dies in the same device package.

In some embodiments, memory controller 27 comprises a general-purpose processor, which is programmed in software to carry out the functions described herein. The software may be downloaded to the processor in electronic form, over a network, for example, or it may, alternatively or additionally, be provided and/or stored on non-transitory tangible media, such as magnetic, optical, or electronic memory.

The description that follows describes techniques for data storage and retrieval in memory array 25. The disclosed techniques can be carried out by memory controller 27 and/or by R/W unit 26. For the sake of clarity, the description that follows refers to a particular division of functions between R/W unit 26 in the memory device and processor 29 in memory controller 27. Generally, however, the various tasks making-up the disclosed techniques can be divided between the memory controller and the R/W unit in any suitable manner, or performed by any one of these elements. Thus, in the context of the present patent application and in the claims, memory controller 27 and R/W unit 26 are referred to jointly as storage circuitry that carries out the disclosed techniques.

3-D Memory Structure

Figure 2:
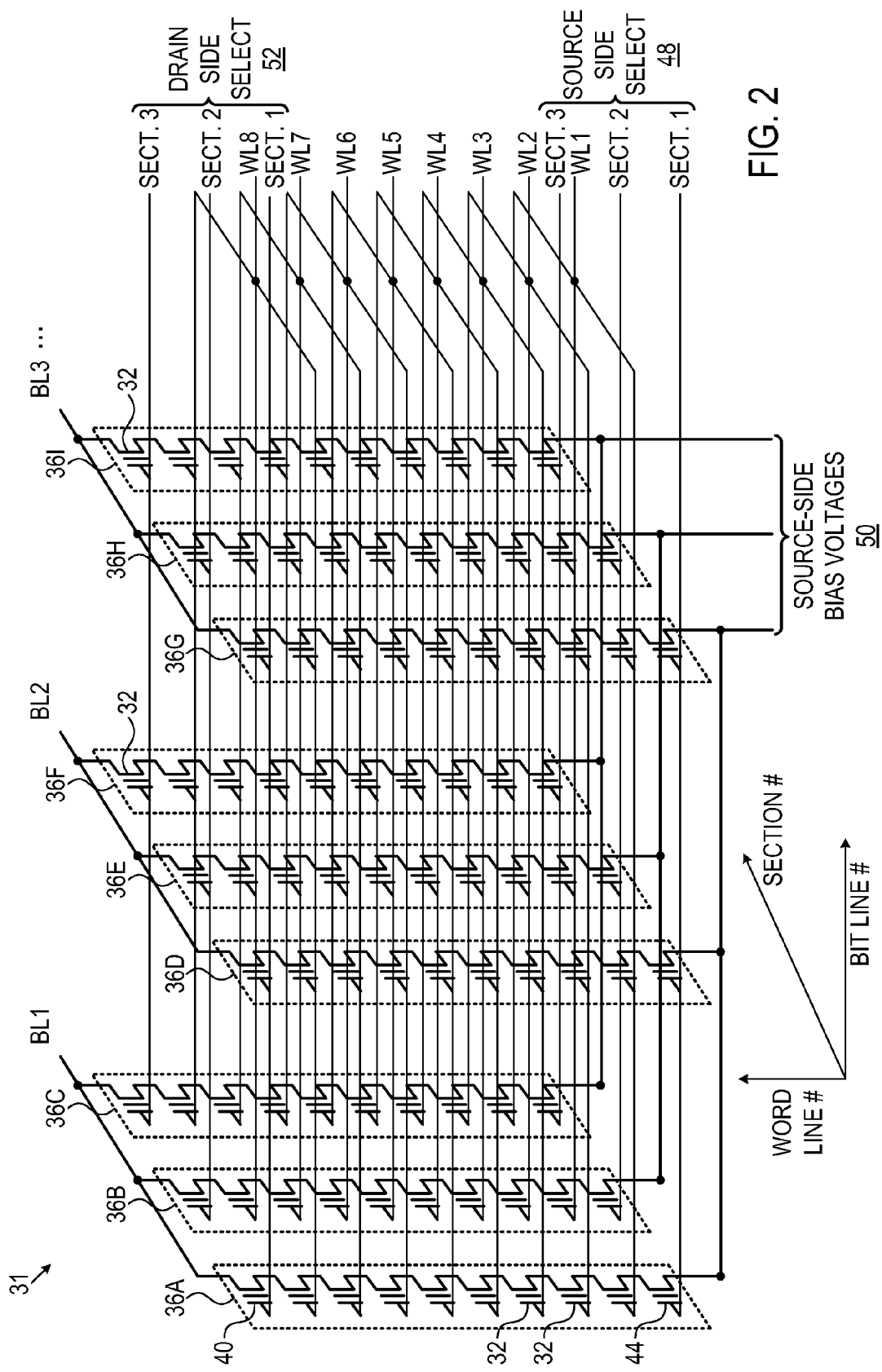
FIG. 2 is a block diagram that schematically illustrates a three-dimensional (3-D) memory block, in accordance with an embodiment of the present invention.

FIG. 2 is a block diagram that schematically illustrates the internal structure of a 3-D memory block 31 in array 25, in accordance with an embodiment of the present invention. The figure shows a single 3-D memory block for the sake of clarity. The other memory blocks in array 25 typically have a similar structure. Note that the configuration of FIG. 2 shows the topology and electrical connectivity of block 31, but not necessarily the physical arrangement of the memory cells. An example physical implementation is described further below.

Memory block 31 comprises multiple memory cells 32 that are arranged in a three-dimensional structure. The three dimensions of the memory block are associated with bit lines (denoted BL1, BL2, BL3, . . . ), word lines (denoted WL1 . . . WL8) and sections (denoted SECTION1, SECTION2, SECTION3), respectively. The sections are selected using drain-side select lines 52 (one line for each respective section) and source-side select lines 48 (one line for each respective section). The WLs, BLs, drain-side select lines and source-side select lines are accessed by R/W unit 26, as will be explained below.

Each memory cell 32 belongs to a certain cell string 36, which are also referred to as pillars. The figure shows nine strings denoted 36A . . . 36I. Strings 36A, 36D, 36G, . . . belong to SECTION1, strings 36B, 36E, 36H, . . . belong to SECTION2, and strings 36C, 36F, 36I, . . . belong to SECTION3. The figure shows only the first three strings of each section for the sake of clarity. The 3-D memory block typically comprises thousands of bit lines, and thus thousands of strings in each section.

In each string, each memory cell is connected to a respective WL. The number of memory cells per string is thus equal to the number of WLs. As can be seen in the figure, the first WL is connected to the first memory cell in all the strings of all the sections of the block, the second WL is connected to the second memory cell in all strings, and so on. Memory cells 32 in a given string are connected source-to-drain is series with one another.

A page of data is typically written by R/W unit 26 to a group of memory cells 32 that belongs to a certain WL and lies in a certain section. In a Multi-Level Cell (MLC) device, two or more pages can be written to the same group of cells. For example, a page of data can be written to the first memory cells in strings 36A, 36D, 36G, . . . , i.e., the group of memory cells belonging to WL1 and to SECTION1. Another page can be written to the second memory cells in strings 36A, 36D, 36G, . . . , i.e., the group of memory cells belonging to WL2 and to SECTION1. Similarly, a page can be written to the $i^{th}$ memory cells (i=1 . . . 8) of the strings of any section. Data readout is also performed by page in a similar manner.

In order to access a certain set of strings 36, e.g., for writing or reading data, R/W unit 26 enables the appropriate strings using drain-side select lines 52 and source-side select lines 48. Each string 36 comprises a drain-side select switch 40 that is controlled by the appropriate drain-side select line 52, and a source-side select switch 44 that is controlled by the appropriate source-side select switch 48. The drain of the first memory cell is connected to the respective drain-side select line, and the source of the last memory cell is connected to the respective source-side select line. For example, in order to access a page of data that is stored in SECTION2, R/W unit 26 selects the drain-side select line 52 and the source-side select line 48 of SECTION2, and then accesses the WL to which the group of cells belongs.

In the present example, for each bit line, the source-sides of the strings of different sections are not connected to one another and can be biased separately with suitable source-side voltages 50. In some embodiments that are described herein, R/W unit 36 applies different source-side voltages 50 to the strings of a given bit line during programming and/or readout. Several examples of such schemes and the performance benefits they provide are explained further below.

The configuration of block 31 shown in FIG. 2 is an example configuration that is chosen purely for the sake of conceptual clarity. In alternative embodiments, any other suitable configuration can be used. For example, in some embodiments, different strings in the same section may also be biased with different source-side voltages.

Moreover, the configuration of FIG. 2 shows the topology and electrical connectivity of block 31, but not necessarily the physical arrangement of the memory cells and strings. In an example physical implementation, each string 36 is U-shaped, and the U-shaped strings are fabricated on a common substrate. In this "folded" configuration both drain-side select lines 52 and source-side select lines 48 are accessible from the top of the device. Block 31 may be fabricated, for example, using a Silicon-Oxide-Nitride-Oxide-Silicon (SONOS) process, or using any other suitable semiconductor process.

Equalization of Programming Speed Using String-Specific Source-Side Voltages

In some embodiments, the storage circuitry in system 20 (processor 29 in memory controller 27, and/or R/W circuitry 26 in memory device 24) estimates the properties of various strings 36, and calculates source-side bias voltages 50 applied to the strings depending on the string properties. The storage circuitry may calculate the source-side voltages based on any suitable string property. The ability to set the source-side voltage individually per string enables system 20 to achieve superior performance, such as low program and read disturb. FIGS. 3-7 below describe several example schemes of this sort.

Figure 3:
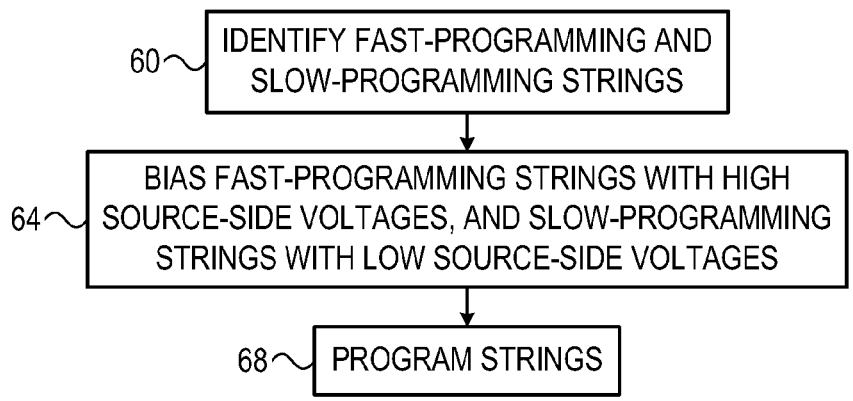
FIGS. 3-7 are flow charts that schematically illustrate methods for data storage in a 3-D memory, in accordance with embodiments of the present invention.

FIG. 3 is a flow chart that schematically illustrates a method for data storage in 3-D memory 31, in accordance with an embodiment of the present invention. In this method, the source-side voltage of each string is set depending on the responsiveness of the string to programming pulses.

Typically, R/W unit 26 programs a certain page by applying a sequence of programming pulses to the memory cells in a selected group of memory cells. Each programmed memory cell belongs to a different string. After each pulse, the R/W unit senses ("verifies") the memory cell threshold voltages. Subsequent programming pulses are applied only to the memory cells that have not yet reached their intended programming level. This process is commonly referred to as Programming and Verification (P&V).

In practice, memory cells 32 may differ from one another in their responsiveness to programming. High responsiveness means that low pulse energy (e.g. fewer programming pulses) is needed to charge the memory cell to a target programming level. A low-responsiveness memory cell requires higher pulse energy (e.g. more programming pulses) to reach the same target level. When programming a page, different programmed memory cells (and thus their respective strings) may respond differently to programming.

In order to reduce distortion in the memory cells, it is generally desirable that the various memory cells in the programmed group will reach the target programming level approximately at the same time, i.e., after the same number of programming pulses: The P&V operation compensates for distortion in the programmed cells, as long as the distortion is present at the time of verification. Therefore, if a memory cell is slow to respond to programming, it will receive its final programming pulses after the other cells completed programming. As a result, the slow cell will cause program disturb that cannot be canceled by the P&V process.

Therefore, it is generally desirable to equalize the number of programming pulses across the group of memory cells that are programmed by a given write operation. In some embodiments, the storage circuitry in system 20 equalizes the number of programming pulses by applying higher source-side voltages to high-responsiveness (fast-programming) strings, and lower source-side voltages to low-responsiveness (slow-programming) strings.

Reducing the source-side voltage of the string increases the difference in electrical potential between the gate and source of the programmed memory cell, and therefore increases the effect of the programming pulses and increases programming speed. Increasing the source-side voltage of the string reduces the gate-source potential difference and thus slows-down the programming. Therefore, reducing the source-side voltages of low-responsiveness strings and increasing the source-side voltages of high-responsiveness strings helps to equalize the programming speed of the strings, thereby reducing program disturb.

The method of FIG. 3 begins with the storage circuitry identifying fast-programming (high-responsiveness) strings and slow-programming (low-responsiveness) strings, at a responsiveness identification step 60. For example, the storage circuitry may record the numbers of pulses needed to program the various strings in previous P&V operations.

Another possibility is to determine the number of pulses needed for a memory cell, which is being programmed to some high programming state, to pass the verification threshold of a lower programming state. In this method too, the number of pulses is indicative of whether the memory cell is fast- or slow-programming. In the latter scheme, however, the decision is taken in real-time and there is no need for the storage circuitry to record information from previous storage operations.

As yet another example, the storage circuitry may use an additional verification threshold (which may be positive or negative), and determine the number of pulses needed for memory cells to reach this threshold as a measure of the programming-responsiveness of the cells. This technique can be applied during the first one or two pulses, and a memory cell that has not reached the additional verification threshold will be considered slow-programming. Additionally or alternatively, the storage circuitry may estimate the programming responsiveness of the strings in any other suitable way.

When preparing to store a page in a group of memory cells (belonging to respective strings), the storage circuitry biases the fast-programming memory cells with high source-side voltages, and the slow-programming memory cells with low source-side voltages, at a responsiveness-based biasing step 64. The storage circuitry then programs the page, at a storage step 68.

Another possible way of equalizing the programming speed of the various strings (and thus reducing program disturb) is to set the source-side voltage for a given string based on the target programming level of the string. In these embodiments, when preparing to program a page into a group of memory cells, the storage circuitry determines the target programming level for each cell, and sets the source-side voltage of the string of each cell depending on the target programming level of that cell.

Typically, cells that are assigned high programming levels (corresponding to high threshold voltage $V_{TH}$) are applied low source-side voltages (and thus large gate-source potential). Memory cells that are assigned low programming levels (corresponding to small $V_{TH}$) are applied low source-side voltages (and thus small gate-source potential). Such a voltage setting increases the programming speed of high programming levels, and vice versa, and therefore equalizes the programming speed across the group of strings.

Figure 4:
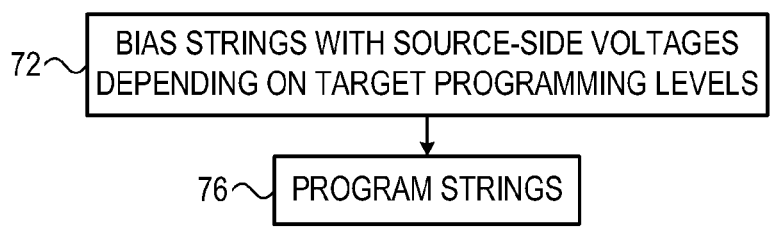

FIG. 4 is a flow chart that schematically illustrates a method for data storage in 3-D memory 31, in accordance with an embodiment of the present invention. The method begins with the storage circuitry preparing to store a page of data in a group of memory cells. Programming the page involves programming each cell in the group to a certain target programming level representing one or more bits to be stored in the cell.

Before programming, the storage circuitry biases the strings of the cells in the group with respective source-side voltages that depend on the target programming levels of the cells in the group, at a level-based biasing step 72. The storage circuitry then programs the page, at a programming step 76.

Reduction of Program Disturb in Unselected Strings Using Source-Side Inhibit Voltages As explained above, the storage circuitry typically programs a group of memory cells using P&V, by applying a sequence of programming pulses to the group. While applying a given programming pulse, some strings are unselected and inhibited, in order to prevent the pulse from affecting them. The inhibited strings may belong to the programmed group (strings of cells in the group that are not to be programmed or that have already reached their target programming level), or they may be outside the programmed group (e.g., sharing the same bit lines and word lines but in another section).

In some embodiments, when applying a programming pulse, the storage circuitry inhibits the unselected strings by applying inhibit voltage both on the drain-side and on the source-side of the strings. Selected strings are applied normal programming drain-side and source-side voltages that are different from the inhibit voltages.

Figure 5:
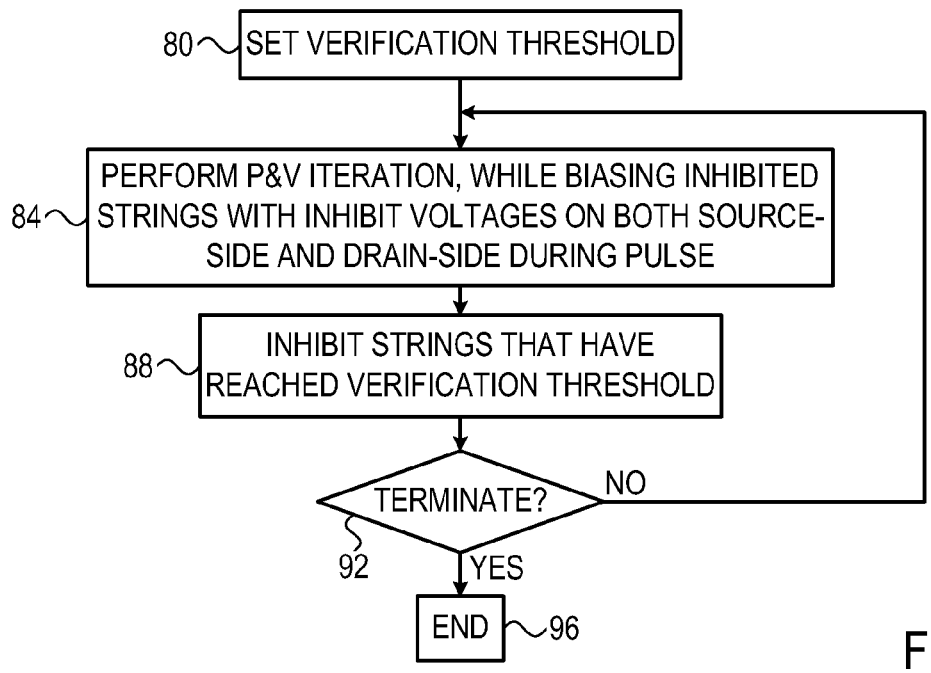

FIG. 5 is a flow chart that schematically illustrates a method for data storage in 3-D memory 31, in accordance with an embodiment of the present invention. The method begins with the storage circuitry sets a verification threshold denoted PV, in preparation for programming a page to a certain programming level, at a PV setting step 80. The storage circuitry then begins an iterative P&V process that programs a subset of the memory cells in the group to the desired programming level.

The storage circuitry applies a programming pulse, at a pulse programming step 84. During the pulse (usually shortly before applying the pulse), the storage circuitry biases the unselected strings (strings of the cells that are not to be affected by the pulse) with inhibit source-side and drain-side voltages. In a given string, the source-side and drain-side voltage may be the same or different.

After the pulse, the programming circuitry reads the memory cells in the group and inhibits the strings of the cells that have reached the desired programming level (i.e., the cells whose $V_{TH}$ exceeds PV), at a verification step 88. The storage circuitry then checks whether programming is to be terminated, at a termination checking step 92. The programming may be terminated, for example, when all the cells in the group have reached the intended programming level, or after a predefined maximum number of iterations.

If the programming is to be terminated, the storage circuitry ends the method, at a termination step 96. Otherwise, the method loops back to step 84 above for performing the next P&V iteration.

Fast Evaluation of Read Thresholds Using String-Specific Source-Side Voltages

In some embodiments, the storage circuitry uses string-specific source-side biasing to evaluate multiple read thresholds in parallel over the same word line. This technique uses the fact that adjustment of the source-side voltage is equivalent to adjustment of a read threshold. By evaluating multiple possible read thresholds in parallel, threshold acquisition and/or adaptation can be performed at high speed. Certain aspects of parallel read threshold evaluation are addressed in U.S. patent application Ser. No. 13/590,816, filed Aug. 21, 2012, which is assigned to the assignee of the present patent application and whose disclosure is incorporated herein by reference.

Figure 6:
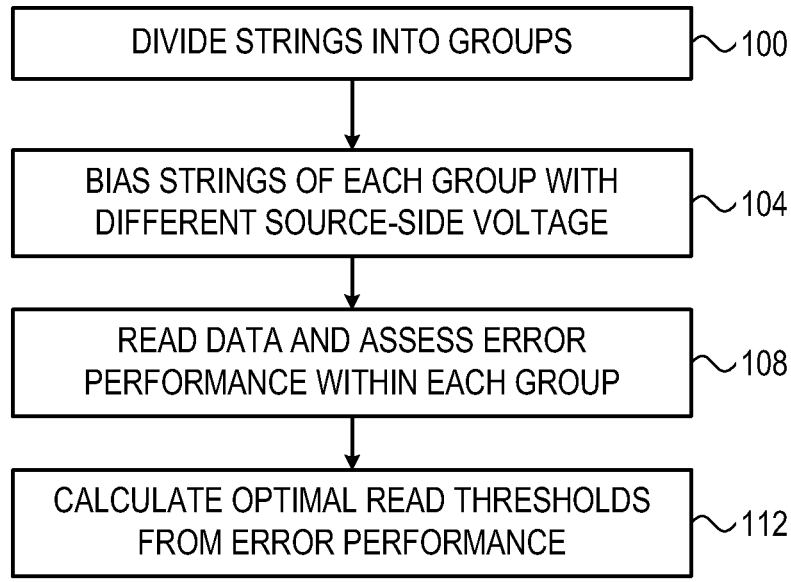

FIG. 6 is a flow chart that schematically illustrates a method for read threshold adaptation in 3-D memory 31, in accordance with an embodiment of the present invention. The method begins with the storage circuitry dividing the strings of a certain word line (possibly limited to a certain section) into groups, at a partitioning step 100. In an example embodiment, 3-D memory block 31 comprises 16K bit lines, and the 16K strings of a certain section are divided into eight groups of 2048 strings each. Alternatively, any other suitable numbers of strings and groups can be used.

The storage circuitry biases each group of strings with a respective different source-side voltage, at a group biasing step 104. In an example embodiment, the source-side voltages of the various groups are set at certain increments relative to some nominal voltage $V_{NOM}$, e.g., $V_{NOM} \pm 0.1V$, $V_{NOM} \pm 0.2V$, $V_{NOM} \pm 0.3V$, .... Alternatively, any other suitable voltages can be used. Setting the source-side voltage at an offset relative to the nominal source-side voltage is equivalent to shifting the read threshold by a certain offset from its nominal position.

The storage circuitry then reads the data from the memory cells of the word line (and possibly section), typically in a single page-read operation, at a readout step 108. After reading the data, the storage circuitry assesses the number of read errors in the memory cells belonging to each group of strings, at an error estimation step 108. The number of errors in a group is indicative of the performance of the corresponding read threshold.

The storage circuitry may assess the number of errors in various ways. For example, the stored data may comprise a separate Error Correction Code (ECC) code word in each group of memory cells, such that the storage circuitry is able to count the number of errors per group. In another embodiment, the stored data comprises a single ECC code word, and the ECC enables the storage circuitry to count the number of errors per group. Alternatively, the storage circuitry may assess the number of read errors in each group of cells, i.e., the number of errors associated with each source-side voltage, in any other suitable way.

The storage circuitry calculates the optimal read threshold based on the numbers of errors assessed above, at a threshold calculation step 112. For example, the storage circuitry may select the read threshold that corresponds to the source-side voltage that yielded the smallest number of errors. In other embodiments, the storage circuitry may compute an optimal read threshold that does not correspond to any of the source-side voltages used for readout, e.g., by interpolation.

The description above referred mainly to setting of a single read threshold, e.g., a threshold for reading a Single-Level Cell (SLC) memory or for reading a Least Significant Bit (LSB) page from a Multi-Level Cell (MLC) memory. The disclosed technique, however, can be used in a similar manner to set multiple read thresholds, such as the read thresholds used for reading higher-order pages from MLC memory.

The read thresholds calculated using the method of FIG. 6 can be used for reading data from the same word line, from other word lines in the same block, or even for reading word lines from other 3-D blocks, provided that the read word lines have similar conditions (e.g., endurance and retention) as the word line used for the calculation.

Source-Side Voltage Setting Based on Memory Cell Threshold Voltage

In some embodiments, when preparing to read a group of memory cells, the storage circuitry sets the source-side voltage for each string based on the threshold voltage ($V_{TH}$) of the selected memory cell in that string. This technique is useful, for example, for reducing retention shift and other forms of distortion that depend on the cell $V_{TH}$.

Consider, for example, a group of memory cells that are subject to a long retention period. The threshold voltages of the memory cells tend to drift downwards over time. In many practical memory devices, the rate of the $V_{TH}$ drift depends on $V_{TH}$: Cells that are programmed to high $V_{TH}$ typically exhibit faster drift than cells that are programmed to small $V_{TH}$.

Thus, in some embodiments, the storage circuitry applies a smaller source-side voltage to the strings of the memory cells that hold higher $V_{TH}$, and a larger source-side voltage to the strings of the memory cells that hold lower $V_{TH}$. This sort of biasing equalizes the rate of drift over the strings in the group. As a result, overlap between adjacent programming levels is reduced, and readout performance is improved.

Similar source-side biasing can be used to counteract other forms of distortion that depend on cell $V_{TH}$, such as read disturb, cross-coupling interference between cells, and Back Pattern Dependency (BPD)—considering the word line location within the block.

Figure 7:
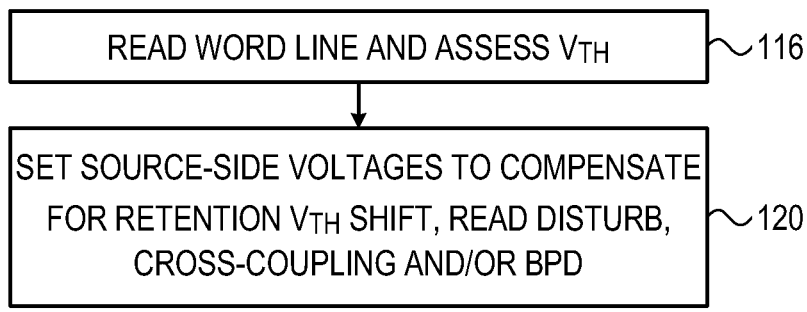

FIG. 7 is a flow chart that schematically illustrates a method for data storage in 3-D memory 31, in accordance with an embodiment of the present invention. The method begins with the storage circuitry in system 20 assessing the threshold voltages of the memory cells in the group, e.g., by reading the cells, at a $V_{TH}$ assessment step 116. This readout operation may be performed with rough accuracy, since its purpose is to assess the cell threshold voltages roughly, and not to fully recover the data.

The storage circuitry sets the source-side voltage for each string based on the assessed $V_{TH}$ of the selected cell in that string, at a $V_{TH}$-based biasing step 120. When compensating for retention drift, the setting of source-side voltages may depend on prior information as to the retention history of the memory cells, e.g., using analysis of cell $V_{TH}$ distribution in the block.

It will be appreciated that the embodiments described above are cited by way of example, and that the present invention is not limited to what has been particularly shown and described hereinabove. Rather, the scope of the present invention includes both combinations and sub-combinations of the various features described hereinabove, as well as variations and modifications thereof which would occur to persons skilled in the art upon reading the foregoing description and which are not disclosed in the prior art. Documents incorporated by reference in the present patent application are to be considered an integral part of the application except that to the extent any terms are defined in these incorporated documents in a manner that conflicts with the definitions made explicitly or implicitly in the present specification, only the definitions in the present specification should be considered.

The invention claimed is:

1. A method, comprising:
   storing data in a memory, which comprises multiple strings of analog memory cells arranged in a three-dimensional (3-D) configuration having a first dimension associated with bit lines, a second dimension associated with word lines and a third dimension associated with sections, such that each string is associated with a respective bit line and a respective section and comprises multiple memory cells that are connected to the respective word lines;
   for a group of the strings, evaluating respective values of a property of the strings in the group;
   calculating source-side voltages for the respective strings in the group, depending on the respective values of the property, and biasing respective source-sides of the strings in the group with the corresponding source-side voltages; and
   performing a memory operation on the strings in the group while the strings are biased with the respective source-side voltages.

2. The method according to claim 1, wherein calculating the source-side voltages comprises equalizing programming speed over the strings in the group.

3. The method according to claim 1, wherein evaluating the property comprises assessing a responsiveness of the strings in the group to programming, and wherein calculating the source-side voltages comprises assigning each string in the group a respective source-side voltage depending on the responsiveness of the string.

4. The method according to claim 1, wherein evaluating the property comprises determining respective target programming levels of the strings in the group, and wherein calculating the source-side voltages comprises assigning each string in the group a respective source-side voltage depending on a target programming level of the string.

5. The method according to claim 1, wherein evaluating the property comprises verifying which of the strings are to be inhibited from receiving a subsequent programming pulse, and wherein calculating the source-side voltages comprises assigning the strings that are to be inhibited a first source-side voltage, and assigning the strings that are not to be inhibited a second source-side voltage that is different from the first source-side voltage.

6. The method according to claim 1, wherein calculating the source-side voltages comprises dividing the group of strings into multiple subsets and assigning different source-side voltages to the respective subsets, and wherein performing the memory operation comprises reading the data from a plurality of the memory cells belonging respectively to the strings in the group while the subsets are biased with the respective different source-side voltages, and calculating one or more optimal read thresholds based on the read data.

7. The method according to claim 6, wherein calculating the optimal read thresholds comprises assessing numbers of read errors in the data read from the respective subsets, and computing the read thresholds based on the numbers of errors.

8. The method according to claim 1, wherein evaluating the property comprises assessing respective analog storage values stored in selected memory cells in the respective strings, and wherein calculating the source-side voltages comprises assigning each string in the group a respective source-side voltage depending on a respective analog storage value.

9. Apparatus, comprising:
a memory, which comprises multiple strings of analog memory cells arranged in a three-dimensional (3-D) configuration having a first dimension associated with bit lines, a second dimension associated with word lines and a third dimension associated with sections, such that each string is associated with a respective bit line and a respective section and comprises multiple memory cells that are connected to the respective word lines; and
storage circuitry, which is configured, for a group of the strings, to evaluate respective values of a property of the strings in the group, to calculate source-side voltages for the respective strings in the group depending on the respective values of the property, to bias respective source-sides of the strings in the group with the corresponding source-side voltages, and to perform a memory operation on the strings in the group while the strings are biased with the respective source-side voltages.

10. The apparatus according to claim 9, wherein, by calculating and setting the source-side voltages, the storage circuitry is configured to equalize programming speed over the strings in the group.

11. The apparatus according to claim 9, wherein the storage circuitry is configured to assess a responsiveness of the strings in the group to programming, and to assign each string in the group a respective source-side voltage depending on the responsiveness of the string.

12. The apparatus according to claim 9, wherein the storage circuitry is configured to determine respective target programming levels of the strings in the group, and to assign each string in the group a respective source-side voltage depending on a target programming level of the string.

13. The apparatus according to claim 9, wherein the storage circuitry is configured to verify which of the strings are to be inhibited from receiving a subsequent programming pulse, to assign the strings that are to be inhibited a first source-side voltage, and to assign the strings that are not to be inhibited a second source-side voltage that is different from the first source-side voltage.

14. The apparatus according to claim 9, wherein the storage circuitry is configured to divide the group of strings into multiple subsets, to assign different source-side voltages to the respective subsets, to read the data from a plurality of the memory cells belonging respectively to the strings in the group while the subsets are biased with the respective different source-side voltages, and to calculate one or more optimal read thresholds based on the read data.

15. The apparatus according to claim 14, wherein the storage circuitry is configured to assess numbers of read errors in the data read from the respective subsets, and to calculate the read thresholds based on the numbers of errors.

16. The apparatus according to claim 9, wherein the storage circuitry is configured to assess respective analog storage values stored in selected memory cells in the respective strings, and to assign each string in the group a respective source-side voltage depending on a respective analog storage value.

17. Apparatus, comprising:
an interface, which is configured to communicate with a memory that comprises multiple strings of analog memory cells arranged in a three-dimensional (3-D) configuration having a first dimension associated with bit lines, a second dimension associated with word lines and a third dimension associated with sections, such that each string is associated with a respective bit line and a respective section and comprises multiple memory cells that are connected to the respective word lines; and
storage circuitry, which is configured, for a group of the strings, to evaluate respective values of a property of the strings in the group, to calculate source-side voltages for the respective strings in the group depending on the respective values of the property, to bias respective source-sides of the strings in the group with the corresponding source-side voltages, and to perform a memory operation on the strings in the group while the strings are biased with the respective source-side voltages.

18. The apparatus according to claim 17, wherein, by calculating and setting the source-side voltages, the storage circuitry is configured to equalize programming speed over the strings in the group.

19. The apparatus according to claim 17, wherein the storage circuitry is configured to assess a responsiveness of the strings in the group to programming, and to assign each string in the group a respective source-side voltage depending on the responsiveness of the string.

20. The apparatus according to claim 17, wherein the storage circuitry is configured to determine respective target programming levels of the strings in the group, and to assign each string in the group a respective source-side voltage depending on a target programming level of the string.

* * * * *